(12) United States Patent
Nishinaka et al.

(10) Patent No.: US 7,179,519 B2
(45) Date of Patent: Feb. 20, 2007

(54) POLYIMIDE/METAL LAMINATE, AND ELECTRIC/ELECTRONIC EQUIPMENT BASES, MAGNETIC RECORDING BASES, SOLAR BATTERY BASES, COATING FILM FOR AEROSPACE MATERIALS AND FILMY RESISTANCE ELEMENTS WITH THE USE THEREOF

(75) Inventors: Masaru Nishinaka, Shiga (JP);
Kiyokazu Akahori, Shiga (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 10/438,907

(22) Filed: May 16, 2003

(65) Prior Publication Data

US 2004/0048079 A1 Mar. 11, 2004

Related U.S. Application Data

(62) Division of application No. 09/522,469, filed on Mar. 9, 2000, now Pat. No. 6,586,081.

(30) Foreign Application Priority Data

Mar. 12, 1999 (JP) ............................. P. 11-065983

(51) Int. Cl.
*B32B 3/00* (2006.01)
*C08K 5/52* (2006.01)

(52) U.S. Cl. .................. 428/209; 428/473.5; 174/258; 174/259; 524/115; 524/127; 524/128; 524/140; 524/141; 524/148; 524/166

(58) Field of Classification Search ................ 428/209, 428/901, 473.5; 174/258–259; 524/115, 524/127–128, 140–141, 148, 166
See application file for complete search history.

(56) References Cited

U.S. PATENT DOCUMENTS

| 4,742,099 A | | 5/1988 | Nagano et al. ............. 524/115 |
| 4,886,874 A | * | 12/1989 | Nagano et al. ............. 528/353 |
| 5,130,192 A | | 7/1992 | Takabayashi et al. ....... 428/332 |
| 6,207,739 B1 | * | 3/2001 | Ono et al. .................. 524/218 |
| 6,350,844 B1 | * | 2/2002 | Ono et al. .................. 528/170 |
| 6,475,624 B1 | * | 11/2002 | Nishinaka et al. .......... 428/421 |

* cited by examiner

*Primary Examiner*—Cathy F. Lam
(74) *Attorney, Agent, or Firm*—Westerman, Hattori, Daniels & Adrian, LLP.

(57) ABSTRACT

Polyimide/metal laminates having a polyimide film and a metal layer laminated thereon, wherein the polyimide film contains titanium element and flexible print wiring boards with the use of the same are disclosed. The polyimide/metal laminates are excellent in adhesion under the ordinary conditions and, moreover, can sustain the adhesive strength at a high ratio after exposure to high temperature or high temperature and high humidity. Owing to these characteristics, these polyimide/metal laminates are appropriately usable in flexible print wiring boards, multi-layered print wiring boards, rigid flex wiring boards, tapes for TAP, semiconductor packages such as CFOs and multi chip modules (MCMs), magnetic recording films, coating films for aerospace materials and filmy resistance elements.

19 Claims, No Drawings

POLYIMIDE/METAL LAMINATE, AND ELECTRIC/ELECTRONIC EQUIPMENT BASES, MAGNETIC RECORDING BASES, SOLAR BATTERY BASES, COATING FILM FOR AEROSPACE MATERIALS AND FILMY RESISTANCE ELEMENTS WITH THE USE THEREOF

This application is a divisional of U.S. patent application Ser. No. 09/522,469, filed on Mar. 09, 2000, now U.S. Pat. No. 6,586,081.

FIELD OF THE INVENTION

This invention relates to polyimide/metal laminates which are excellent in adhesion and flexible print wiring boards. More particularly, it relates to polyimide/metal laminates and flexible print wiring boards (in particular, flexible print wiring boards having high heat resistance with the use of imide adhesives), multi-layered print wiring boards wherein flexible print wiring boards are laminated, rigid flex wiring boards wherein flexible print wiring boards are laminated on hard print wiring boards, tapes for tape automated bonding (TAB) wherein polyimide/metal laminates are applied to TAB, semiconductor packages such as chips on film (COF) wherein semiconductor devices are packaged directly on print wiring boards and multi chip modules (MCMs), magnetic recording films, solar batteries, coating films for aerospace materials and filmy resistance elements which are excellent in adhesion under the ordinary conditions and, moreover, can sustain the adhesive strength at a high ratio after exposure to high temperature or high temperature and high humidity and thus can exert favorable functions even in the environment with high temperature and high humidity.

BACKGROUND OF THE INVENTION

With the recent increasing demand for small-sized and high-performance electric apparatuses, flexible print wiring boards are employed more frequently under severer conditions, for example, at high temperature and high humidity. Thus, there have been strongly required polyimide/metal laminates and flexible print wiring boards withstanding the environment with high temperature and high humidity. Flexible print wiring boards are obtained by directly laminating a metal such as copper on a polyimide film by, for example, metallizing or plating, or by laminating a metal layer such as a copper foil on a polyimide film via an adhesives to thereby give a polyimide/metal laminate and then patterning the polyimide/metal laminate by etching the metal part. Therefore, it is also required that polyimide/metal laminates also have adequate mechanical and electrical characteristics so as to withstand the environment with high temperature and high humidity.

Among all, it is particularly strongly required that the adhesion of polyimide films should withstand the environment as described above.

Thus, various attempts have been made to improve the adhesion of polyimide films.

For example, U.S. Pat. No. 4,742,099 (corresponding to Japanese Patent No. 1,948,445) discloses a technique of improving the adhesion of a polyimide film by adding an organotitanium compound thereto. However, this technique suffers from problems such as causing serious coloration of the film and damaging the fragility of the film due to the existence of titanium atoms at a high concentration within the film.

On the other hand, U.S. Pat. No. 5,227,224 (corresponding to JP-A-6-73209) discloses a polyimide having improved surface adhesive strength which is coated with a metal salt of Sn, Cu, Zn, Fe, Co, Mn or Pd. In the invention, in contrast thereto, not any metal salt of Sn, Cu, Zn, Fe, Co, Mn or Pd but titanium is employed as a metal.

Further, U.S. Pat. No. 5,130,192 discloses a method wherein a polyimide film obtained by coating a solidified polyamic acid film with a heat-resistant surface treatment agent followed by imidization is metallized. However, no highly heat-resistant treating agent is employed in the invention.

In these conventional techniques, there arise some problems such that the films are seriously colored and become fragile due to the titanium element which exists at a high concentration within the film.

Moreover, use of the surface treatment agent suffers from additional problems such that a highly heat-stable one should be employed.

The inventors have conducted intensive studies to solve the problems encountering in the conventional art as described above by providing polyimide/metal laminates and flexible print wiring boards, multi-layered print wiring boards wherein flexible print wiring boards are laminated, rigid flex wiring boards wherein flexible print wiring boards are laminated on hard print wiring boards, tapes for tape automated bonding (TAB) wherein polyimide/metal laminates are applied to TAB, semiconductor packages such as chips on film (COF) wherein semiconductor devices are packaged directly on print wiring boards and multi chip modules (MCMs), magnetic recording films, solar batteries, coating films for aerospace materials and filmy resistance elements which are excellent in environmental resistance.

SUMMARY OF THE INVENTION

The polyimide/metal laminate according to the invention is one wherein the polyimide film contains titanium element.

The polyimide/metal laminate according to the invention is one wherein use is made of a polyimide film obtained by casting or applying a polyamic acid onto a substrate; drying the same to give a partly cured or partly dried film made of the polyamic acid or a polyimide; applying an organic solvent solution containing titanium element on the surface of the film, or immersing the film in an organic solvent solution containing titanium element; then converting the polyamide into the polyimide; and drying the film.

It is preferable that use is made of a polyimide film having a titanium atom number concentration on the surface of said polyimide film, determined by X-ray photoelectron spectroscopy, of from 0.01% to 10%.

It is preferable that the partly cured or partly dried polyamic acid or polyimide film as described above has a residual content of volatiles 5 to 100%, preferably 5 to 70% and still preferably 5 to 50%.

It is preferable that the partly cured or partly dried polyamic acid or polyimide film has an imidization rate of 50% or more, preferably 80% or more, more preferably 85% or more and most preferably 90% or more.

It is preferable that the polyimide/metal laminate according to the invention is one wherein use is made of a polyimide film obtained by applying an organic solvent solution containing titanium element onto the surface of the partly cured or partly dried polyamic acid or polyimide film, or immersing the film in an organic solvent solution containing titanium element; removing the excess droplets remaining on the film surface by, for example, using a squeegee roll (generally composed of two rolls held at an interval less than the thickness of film) or spraying an air stream; then converting the polyamide into the polyimide; and drying the film.

It is preferable that the organic solvent solution containing titanium element as described above is a solution of an organotitanium compound, still preferably an organotitanium compound represented by the following formula (1), in an organic solvent:

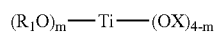  (1)

wherein m is an integer of 0 to 4; and X represents

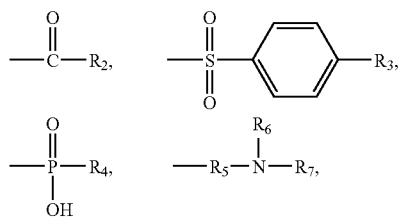

(wherein $R_1$ represents a hydrogen atom or a $C_{3-18}$ hydrocarbyl group; $R_2$ and $R_3$ represent each a $C_{3-18}$ hydrocarbyl group; $R_4$ represents a $C_{3-18}$ hydrocarbyl group or

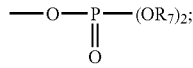

$R_5$ and $R_6$ represent each a $C_{3-8}$ hydrocarbyl group; and $R_7$ represents a $C_{2-18}$ hydrocarbyl group), a $C_{3-18}$ hydrocarbyl or carboxylate group or ammonium salts thereof.

The polyimide/metal laminate according to the invention is one wherein the metal is laminated directly on the polyimide film by, for example, the vacuum metallizing method, the sputtering method, or the wet plating method. It is also possible to successively or simultaneously laminate two or more metals to give an alloy.

The polyimide/metal laminate according to the invention which is obtained by, after laminating the metal directly on the polyimide film, further laminating another metal different from the metal thereon.

The polyimide/metal laminate according to the invention is one which is obtained by laminating the metal directly on the polyimide film by the vacuum metallizing method, the sputtering method or the wet plating method, wherein the polyimide/metal laminate has an adhesive strength of 1000 N/m or more at pattern intervals of 3 mm and at a peel angle of 90° and a peel speed of 50 mm/min.

The polyimide/metal laminate according to the invention is one wherein the metal is laminated on the polyimide film via an adhesive, for example, an epoxy adhesive, a nylon adhesive, an acrylic adhesive, an imide adhesive or a mixture of these adhesives.

The polyimide/metal laminate according to the invention is one wherein the polyimide film has a thickness of 5 to 50 μm.

The polyimide/metal laminate according to the invention is one wherein the polyimide film has a thickness of 5 to 30 μm.

The polyimide/metal laminate according to the invention is one wherein the polyimide film has a thickness of 5 to 15 μm.

The polyimide/metal laminate according to the invention is one wherein use is made of a polyimide film obtained by dehydrocyclizing a polyamic acid in the presence of a catalyst and a dehydrating agent.

The polyimide/metal laminate according to the invention is one wherein use is made of a polyimide film obtained by dehydrocyclizing a polyamic acid comprising as main components pyromellitic anhydride and 4,4'-diaminodiphenyl ether.

The polyimide/metal laminate according to the invention is one wherein use is made of a polyimide film obtained by dehydrocyclizing a polyamic acid comprising as main components three components of pyromellitic anhydride, 4,4'-diaminodiphenyl ether and p-phenylenediamine.

The polyimide/metal laminate according to the invention is one wherein use is made of a polyimide film obtained by dehydrocyclizing a polyamic acid comprising as main components four components of pyromellitic anhydride, 4,4'-diaminodiphenyl ether, p-phenylenediamine and p-phenylenebis(trimellitic acid monoester acid anhydride).

The polyimide/metal laminate according to the invention is one wherein the titanium element concentration at the center in the film thickness direction is 1/10 or less of the titanium element concentration on the film surface.

The flexible print wiring board, multi-layered print wiring board, rigid flex wiring board, tape for TAB, COF, semiconductor package, magnetic recording film, solar battery, coating film for aerospace materials and filmy resistance elements according to the invention are those wherein the polyimide/metal laminate according to the invention is employed.

The process for producing a polyimide/metal laminate which comprises laminating a metal on a polyamide film which contains titanium element and has such an improved environmental resistance that, after exposure to the environment at 150° C. and 100% RH for 24 hours, the tear propagation strength amounts to 80% or more of the level before the exposure.

The process for producing a polyimide/metal laminate which comprises laminating a metal directly on a polyimide film by the vacuum metallizing method, the sputtering method or the wet plating method, and treating the resulting laminate by heating at, preferably 100° C. or more, more preferably 130° C. or more and most preferably 150° C. or more.

DETAILED DESCRIPTION OF THE INVENTION

According to the invention, the polyimide/metal laminates and flexible print wiring boards (in particular, flexible print wiring boards having high heat resistance with the use of imide adhesives), multi-layered print wiring boards wherein flexible print wiring boards are laminated, rigid flex wiring boards wherein flexible print wiring boards are laminated on hard print wiring boards, tapes for tape automated bonding (TAB) wherein polyimide/metal laminates are applied to TAB, semiconductor packages such as chips on film (COF) wherein semiconductor devices are packaged directly on print wiring boards and multi chip modules (MCMs), magnetic recording films, solar batteries, coating films for aerospace materials and filmy resistance elements are excellent in environmental resistance. More particularly speaking, the invention provides polyimide/metal laminates and flexible print wiring boards (in particular, flexible print wiring boards having high heat resistance with the use of imide adhesives), multi-layered print wiring boards wherein flexible print wiring boards are laminated, rigid flex wiring boards wherein flexible print wiring boards are laminated on hard print wiring boards, tapes for tape automated bonding (TAB) wherein polyimide/metal laminates are applied to TAB, semiconductor packages such as chips on film (COF) wherein semiconductor devices are packaged directly on print wiring boards and multi chip modules (MCMs), magnetic recording films, solar batteries, coating films for aerospace materials and filmy resistance elements which suffer from little decrease in the adhesive strength after exposing to the environment with high temperature and high humidity and, therefore, show high reliability.

Next, the embodiment of the polyimide/metal laminate according to the invention will be described in detail.

First, the polyimide film usable in the polyimide/metal laminate and flexible print wiring board according to the invention will be described. This polyimide film essentially contains titanium element.

The polyimide film to be used in the invention can be produced by publicly known methods as disclosed, for example, in "Journal of Polymer Science: part A vol. 3, pp. 1373–1390 (1965)". Namely, it can be obtained by casting or applying a polyamic acid onto a substrate followed by chemical or thermal imidization. Chemical imidization is preferred from the viewpoints of the toughness, breaking strength and productivity of the film.

As the polyamic acid serving as the precursor of the polyimide to be used in the invention, use can be fundamentally made of any known polyamic acid.

The polyamic acid to be used in the invention is produced usually by dissolving at least one aromatic acid dianhydride and at least one diamine in a substantially equimolar amount of an organic solvent and stirring, under controlled temperature conditions, the thus obtained solution of the polyamic acid in the organic solvent until the polymerization of the acid dianhydride and the diamine is completed.

The polyimide is obtained by imidating the polyamic acid. The imidization may be performed either by the heat cure method or by the chemical cure method. In the heat cure method, the imidization reaction proceeds under heating without resort to any dehydrocyclization agent. In the chemical cure method, on the other hand, the organic solvent solution of the polyamic acid is treated with a chemical converting agent typified by an acid anhydride such as acetic anhydride (a dehydrating agent) and a catalyst typified by a tertiary amine such as isoquinoline, β-picoline or pyridine. It is also possible to employ the chemical cure method together with the heat cure method. The imidization conditions may vary depending on, for example, the type of the polyamic acid, the film thickness and the cure method selected (i.e., the heat cure method and/or the chemical cure method).

Next, materials employed in the polyamic acid composition serving as the polyimide precursor according to the invention will be described.

Examples of the acid anhydride appropriately usable in the polyimide of the invention include pyromellitic acid dianhydride, 2,3,6,7-naphthalenetetracarboxylic acid dianhydride, 3,3',4,4'-biphenyltetracarboxylic acid dianhydride, 1,2,5,6-naphthalenetetracarboxylic acid dianhydride, 2,2',3,3'-biphenyltetracarboxylic acid dianhydride, 3,3',4,4'-benzophenonetetracarboxylic acid dianhydride, 2,2-bis(3,4-dicarboxyphenyl) propane dianhydride, 3,4,9,10-perylenetetracarboxylic acid dianhydride, bis (3,4-dicarboxyphenyl)propane dianhydride, 1,1-bis(2,3-dicarboxyphenyl) ethane dianhydride, 1,1-bis(3,4-dicarboxyphenyl) ethane dianhydride, bis(2,3-dicarboxyphenyl) methane dianhydride, bis(3,4-dicarboxyphenyl) ethane dianhydride, oxydiphthalic acid dianhydride, bis(3,4-dicarboxyphenyl) sulfone dianhydride, p-phenylenebis(trimellitic acid monoester acid anhydride), ethylenebis(trimellitic acid monoester acid anhydride), bisphenol A bis (trimellitic acid monoester acid anhydride) and analogs thereof.

Among these acid anhydride, the most favorable ones to be used in the polyimide/metal laminate according to the invention are pyromellitic acid dianhydride, 3,3',4,4'-benzophenonetetracarboxylic acid dianhydride, 3,3',4,4'-biphenyltetracarboxylic acid dianhydride and p-phenylenebis(trimellitic acid mono ester acid anhydride). It is preferable to use either one of these acid anhydrides or a mixture thereof at an arbitrary ratio.

Examples of the diamines appropriately usable in the polyimide composition of the invention include 4,4'-diaminodiphenylpropane, 4,4'-diaminodiphenylmethane, benzidine, 3,3'-dichlorobenzidine, 4,4'-diaminodiphenylsulfide, 3,3'-diaminodiphenylsulfone, 4,4'-diaminodiphenylsulfone, 4,4'-diaminodiphenyl ether, 3,3'-diaminodiphenyl ether, 3,4'-diaminodiphenyl ether, 1,5-diaminonaphthalene, 4,4'-diaminodiphenyldiethylsilane, 4,4'-diaminodiphenylsilane, 4,4'-diaminodiphenylethylphosphine oxide, 4,4'-diaminodiphenyl N-methylamine, 4,4'-diaminodiphenyl N-phenylamine, 1,4-diaminobenzene(p-phenylenediamine), 1,3-diaminobenzene, 1,2-diaminobenzene and analogs thereof.

Among these diamines usable in the polyimide film, it is particularly preferable to use 4,4'-diaminodiphenyl ether and p-phenylenediamine. It is also preferable to use a mixture of these diamines at a molar ratio of 100:0 to 0:100, still preferably 100:0 to 10:90.

Examples of the preferable combination of the acid dianhydride and the diamine in the present invention include a combination of pyromellitic acid dianhydride with 4,4'-diaminodiphenyl ether, a combination of pyromellitic acid dianhydride with 4,4'-diaminodiphenyl ether and p-phenylenediamine, and a combination of pyromellitic acid dianhydride and p-phenylenebis (trimellitic acid monoester acid anhydride) with 4,4'-diaminodiphenyl ether and p-phenylenediamine. A polyimide synthesized with the use of such a combination of these monomers exhibits excellent characteristics (for example, appropriate modulus of elasticity, high dimensional stability and low water absorption ratio), which makes it useful in the polyimide/metal laminate of the invention.

Preferable examples of the solvent to be used in synthesizing the polyamic acid include amide type solvents such as N,N-dimethylformamide, N,N-dimethylacetamide and N-methyl-2-pyrrolidone. Among all, N,N-dimethylformamide is particularly preferable therefor.

In case of performing the imidization by the chemical cure method, examples of the chemical converting agent to be added to the polyamic acid composition of the invention include aliphatic acid anhydrides, aromatic acid anhydrides, N,N'-dialkylcarbodiimides, lower aliphatic halides, halogenated lower aliphatic halides, halogenated lower fatty acid anhydrides, arylsulfonic acid dihalides, thionyl halides and mixtures of two or more thereof. Among these converting agents, it is preferable to use an aliphatic acid anhydride (for example, acetic anhydride, propionic anhydride, lactic anhydride) or a mixture of two or more thereof.

It is preferable that the chemical converting agent is used in an amount 1 to 10 times, still preferably 1 to 7 times and still preferably 1 to 5 times, larger than the number of moles at the polyamic acid site in the polyamic acid solution.

To effectively carry out the imidization, it is preferable to add the chemical converting agent together with a catalyst. As the catalyst, use can be made of, for example, aliphatic tertiary amines, aromatic tertiary amines and heterocyclic tertiary amines. Among all, those selected from the heterocyclic tertiary amines are particularly preferable. That is, preferable examples of the catalyst include quinoline, isoquinoline, β-picoline and pyridine.

The catalyst is added in an amount of 1/20 to 10 times, preferably 1/15 to 5 times and still preferably 1/10 to 2 times, larger than the number of moles of the chemical converting agent.

When the chemical converting agent and the catalyst are used in insufficient amounts, the imidization cannot proceed effectively. When these additives are used too much, on the contrary, the imidization proceeds quickly thereby deteriorating the handling properties.

The titanium compound to be used in the invention is not particularly restricted, so long as it is an organic or inorganic titanium compound. Examples thereof include halides (for example, chloride, bromide), oxide, hydroxide, carbonate, nitrate, nitrite, phosphate, sulfate, silicate, borate and condensed phosphate of titanium. It is also possible to use an organotitanium compound having an organic compound capable of forming a coordination bond with a titanium atom. Examples thereof include neutral molecules such as diamines and diphosphines, organic compounds having, for example, acetylacetonate, carboxylate or dithiocarbamate ion, and cyclic ligands such as porphyrin. Such a compound is provided in the form of a coupling agent or a metal salt. It is preferable to use therefor a compound having a thermal decomposition temperature, determined by thermogravimetry, of from 100 to 250° C. A compound having a thermal decomposition temperature excluded from the scope as defined above can hardly achieve the desired effect. It is preferable to use compounds represented by the following general formula (1):

$$(R_1O)_m\text{—Ti—}(OX)_{4-m} \quad (1)$$

wherein m is an integer of 0 to 4; and X represents

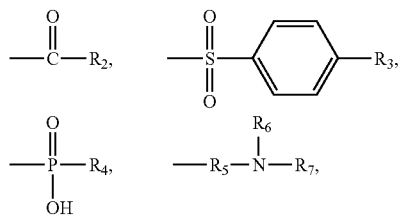

(wherein $R_1$ represents a hydrogen atom or a $C_{3-18}$ hydrocarbyl group, preferably —$C_4H_9$ or —$C_3H_7$; $R_2$ and $R_3$ represent each a $C_{3-18}$ hydrocarbyl group ($R_2$ is preferably —$C_{17}H_{35}$ and $R_3$ is preferably —$C_{12}H_{25}$); $R_4$ represents a $C_{3-18}$ hydrocarbyl group or

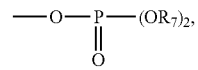

preferably

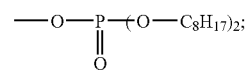

$R_5$ and $R_6$ represent each a $C_{3-18}$ hydrocarbyl group ($R_5$ is preferably —$C_2H_4$— and $R_6$ is preferably —$C_2H_4OH$); and $R_7$ represents a $C_{2-8}$ hydrocarbyl group, preferably —$C_2H_4OH$), a $C_{3-18}$ hydrocarbyl or carboxylate group or ammonium salts thereof.

Particular examples thereof include tri-n-butoxytitanium monostearate, diisopropoxytitanium bis (triethanolaminate), butyl titanate dimer, tetra-n-butyl titanate, tetra(2-ethylhexyl) titanate and titanium octylene glycolate. Moreover, use can be made therefor of dihydroxybis (ammoniumlactate) titanium and dihydroxytitanium bislactate. As the most desirable examples of the titanium compound to be used in the invention, tri-n-butoxytitanium monostearate and dihydroxytitanium bislactate may be cited.

Use of the polyimide film containing titanium element as described above makes it possible to obtain the polyimide/metal laminate and flexible print wiring boards (in particular, flexible print wiring boards having high heat resistance with the use of imide adhesives), multi-layered print wiring boards wherein flexible print wiring boards are laminated, rigid flex wiring boards wherein flexible print wiring boards are laminated on hard print wiring boards, tapes for tape automated bonding (TAB) wherein polyimide/metal laminates are applied to TAB, semiconductor packages such as chips on film (COF) wherein semiconductor devices are packaged directly on print wiring boards and multi chip modules (MCMs), magnetic recording films, solar batteries, coating films for aerospace materials and filmy resistance elements according to the invention which are excellent in durability in the environment with high temperature and high humidity and thus show high reliability. Although it has not been clarified so far why the polyimide film containing titanium element contributes to the improvement in the durability of the polyimide/metal laminate and flexible print wiring boards (in particular, flexible print wiring boards having high heat resistance with the use of imide adhesives), multi-layered print wiring boards wherein flexible print wiring boards are laminated, rigid flex wiring boards wherein flexible print wiring boards are laminated on hard print wiring boards, tapes for tape automated bonding (TAB) wherein polyimide/metal laminates are applied to TAB, semiconductor packages such as chips on film (COF) wherein semiconductor devices are packaged directly on print wiring boards and multi chip modules (MCMs), magnetic recording films, solar batteries, coating films for aerospace materials and filmy resistance elements, it is assumed that the improved environmental resistance of the polyimide film per se might exert some effects.

Titanium element may be added to the polyimide film by various methods. For example, a compound having titanium element is mixed with a solution of a polyamic acid which is a polyimide precursor and then the polyamic acid is converted into the polyimide.

In another method for adding titanium element to the polyimide film, a solution of a titanium element-containing compound is applied onto a partly cured or partly dried polyamic acid film or polyimide film and then the film is dried by heating to thereby complete the imidization.

In another method for adding titanium element to the polyimide film, a partly cured or partly dried polyamic acid film or polyimide film is immersed in a solution of a titanium element-containing compound and then the film is dried by heating to thereby complete imidization.

First, the method for obtaining a polyimide film by mixing titanium element with a polyamic acid solution followed by the conversion of the polyamic acid into the polyimide will be illustrated.

In this method, the acid dianhydride, diamine and titanium compound as described above may be added fundamentally in an arbitrary order.

The polyamic acid solution thus obtained usually contains from 15 to 25% by weight of the polyamic acid in term of solid matter. When the concentration thereof falls within this range, an appropriate molecular weight and an appropriate solution viscosity can be obtained. Namely, it is desirable that the polyamic acid has an average molecular weight of from 10,000 to 1,000,000. When the average molecular weight of the polyamic acid is less than 10,000, the resultant film becomes brittle. When its average molecular weight exceeds 1,000,000, on the other hand, the polyamic acid varnish becomes poor in handling properties due to the excessively high viscosity thereof. Also, from the viewpoint of handling properties, the viscosity of the solution is preferably 1,000 to 10,000 poise, more preferably 2,000 to 5,000 poise.

The titanium compound to be added to the polyamic acid solution may be in a liquid, colloidal, slurry or solid form. It is favorable to add it in the form of a solution diluted with an appropriate solvent, since convenient handling and uniform mixing can be achieved in this case.

Now, the chemical cure method will be described in detail. The polyamic acid composition containing titanium element obtained above is mixed with a chemical converting agent and a catalyst is added. Then the resultant mixture is cast onto a casting face to give a film. Next, it is generally heated to, for example, 100° C. so that the chemical converting agent and the catalyst are activated and the cast film is converted onto a polyamic acid/polyimide gel film (hereinafter referred to as the gel film).

Subsequently, the gel film thus obtained is heated thereby removing moisture and the remaining solvent and chemical converting agent and simultaneously converting the polyamic acid into polyimide.

To avoid heat shrinkage of the film, it is preferable, for example, in the continuous process that the gel film is held at both ends with tender clips or pins in the tentering step.

To dry and imidate the film, it is preferable that the film is heated gradually and continuously and a high temperature is employed within a short period of time in the final heating stage, as commonly performed in the art. More particularly speaking, it is preferable to heat the film to 500 to 600° C. for 15 to 400 seconds in the final stage. When the final heating is performed at a higher temperature or for a longer time, there arises a problem of the heat deterioration of the film. When the final heating is performed at a lower temperature or for a shorter time, on the contrary, no desired effect can be established.

Next, the method for obtaining a polyimide film by applying a solution of a titanium element-containing compound to a partly cured or partly dried polyamic acid film or polyimide film, or immersing the film in the solution, followed by drying by heating will be illustrated.

The partly cured or partly dried polyamic acid film or polyimide film (hereinafter referred to as the gel film) can be produced by a publicly known method. Namely, the polyamic acid is cast or applied onto a substrate such as a glass plate followed by heat imidization. Alternatively, a chemical converting agent and a catalyst are mixed with the polyamic acid solution and then the resultant solution is cast onto a substrate to give a film. Next, the chemical converting agent and the catalyst are activated by heating to about 100° C. Thus a gel film having been cured to such an extent as having self-supporting properties can be obtained.

The gel film is in the course of curing from the polyamic acid into the polyimide and has self-supporting properties. Its residual volatile content, which is calculated in accordance with the following formula 1, ranges from 5 to 500%, preferably from 5 to 100% and still preferably from 5 to 50%. It is appropriate to use a film having the residual volatile content falling within the range as defined above. In case of the residual volatile content being excluded from this range, the desired effects can be hardly established.

$$(A-B) \times 100/B \qquad \text{Formula 1}$$

wherein A represents the weight of the gel film; and B represents the weight of the gel film after heating to 450° C. for 20 minutes.

The imidization rate, which is calculated in accordance with the following formula 2 with the use of infrared absorption spectrometry, of the film is 50% or more, preferably 80% or more, still preferably 85% or more and 90% or more in the most desirable case. It is appropriate to use a film having the imidization rate falling within the range as defined above. In case of the imidization rate being excluded from this range, the desired effects can be hardly established.

$$(C/D) \times 100/(E/F) \qquad \text{Formula 2}$$

wherein C represents the absorption peak height of the gel film at 1370 $cm^{-1}$; D represents the absorption peak height of the gel film at 1500 $cm^{-1}$; E represents the absorption peak height of the polyimide film at 1370 $cm^{-1}$; and F represents the absorption peak height of the gel film at 1500 $cm^{-1}$.

The solvent to be used in the solution of the titanium element-containing compound, which is applied to the gel film or in which the gel film is immersed, in the invention may be an arbitrary one, so long as the compound is soluble therein. For example, use can be made of water, toluene, tetrahydrofuran, 2-propanol, 1-butanol, ethyl acetate, N,N-dimethylformamide or acetyl acetone. It is also possible to use a mixture of two or more of these solvents. In the invention, it is particularly preferable to use N,N-dimethylformamide, 1-butanol and water.

The titanium atom number concentration on the surface of the polyimide film, determined by X-ray photoelectron spectroscopy is preferably from 0.01% to 10%. The titanium element concentration in the solution, determined by the product of the concentration of the titanium compound in the solution and the content of the titanium element in the molecular, is preferably 1 to 10000 ppm, more preferably 10 to 5000 ppm and most preferably 30 to 2000. These concentrations can be obtained by preparing the solution in the titanium compound concentration of 0.001 to 10%, preferably 0.01 to 5% and more preferably 0.03 to 2%.

The solution containing titanium element may be applied to the partly cured or partly dried polyamic acid film or polyimide film by a publicly known method which can be employed by those skilled in the art. For example, use can be made therefor of gravure coating, spray coating or the method with the use of a knife coater. It is particularly preferable to employ the gravure coating method from the viewpoints of controlling the coating weight and achieving uniform coating. The coating weight ranges from 0.1 to 100 g/m$^2$, preferably from 1 to 10 g/m$^2$. When the coating weight is excluded from this range, it is difficult to establish the desired effect while sustaining a good appearance of the film.

The method for immersing the film in the titanium element-containing solution is not particularly restricted. Thus, the deep coating method commonly employed in the art can be used therefor. More particularly speaking, the partly cured or partly dried polyamic acid film or polyimide film is immersed in the solution contained in a tank either continuously or batchwise. The immersion time appropriately ranges from 1 to 100 seconds, preferably 1 to 20 seconds. When the immersion time is excluded from this range, it is difficult to establish the desired effect while sustaining a good appearance of the film.

After applying the solution of the titanium element-containing compound onto the partly cured or partly dried polyamic acid film or polyimide film or immersing the film in the solution, it is preferable to add a step of removing the excessive droplets on the film. This is because a polyimide film which is free from any irregularity on the film surface and thus excellent in the appearance can be obtained thereby. To remove the droplets, use can be made of a publicly known method such as squeezing with nip rolls, an air knife or a doctor blade, wiping off, or suction. From the viewpoints of, for example, the film appearance, draining and handling properties, it is preferable to use nip rolls.

After applying the titanium element-containing solution or immersing therein, the gel film is heated and thus the polyamic acid is converted into the polyimide to give a polyimide film which is appropriately usable in the polyimide/metal laminates and flexible print wiring boards (in particular, flexible print wiring boards having high heat resistance with the use of imide adhesives), multi-layered print wiring boards wherein flexible print wiring boards are laminated, rigid flex wiring boards wherein flexible print wiring boards are laminated on hard print wiring boards, tapes for tape automated bonding (TAB) wherein polyimide/metal laminates are applied to TAB, semiconductor packages such as chips on film (COF) wherein semiconductor devices are packaged directly on print wiring boards and multi chip modules (MCMs), magnetic recording films, solar batteries, coating films for aerospace materials and filmy resistance elements.

To convert the gel film into the polyimide, the gel film is preferably heated gradually and continuously and a high temperature is employed within a short period of time in the final heating stage, as commonly performed in the art. More particularly speaking, it is preferable to heat the film to 500 to 600° C. for 15 to 400 seconds in the final stage. When the final heating is performed at a higher temperature or for a longer time, there arises a problem of the heat deterioration of the film. When the final heating is performed at a lower temperature or for a shorter time, on the contrary, no desired effect can be established.

When the surface of the polyimide film containing titanium element is analyzed by the X-ray photoelectron spectroscopy, titanium element is detected from the film surface at an atom number concentration of 0.01 to 10%. When the atom number concentration of titanium element is less than 0.01%, desired effect can hardly established. On the other hand, when the atom number concentration of titanium element exceeds 10%, it suffers from problems such as causing serious coloration of the film and damaging the fragility of the film.

In the invention, when the titanium concentration distribution in the direction of the thickness of the polyimide film, which is produced by applying the titanium compound solution to the gel film or immersing the film in the solution, is analyzed by using a time-of-flight secondary ion mass spectrometer, titanium exists at a high concentration in the surface layer of the film and the titanium concentration at the center in the film thickness direction is 1/10 or less of its concentration on the film surface.

To the polyimide film obtained by various methods as described above, various additives (for example, inorganic or organic fillers, plasticizers such as organophosphorus compounds, antioxidants) maybe further added by publicly known methods. Moreover, it is possible to subject the polyimide film to publicly known physical surface treatments (for example, corona discharge treatment, plasma discharge treatment) or chemical surface treatments (for example, primer treatment) to thereby impart further favorable properties thereto.

Next, the polyimide/metal laminate according to the invention will be illustrated. In the polyimide/metal laminate of the invention, metal layer(s) are laminated either one or both faces of the polyimide film as obtained above. This polyimide/metal laminate can be produced by any method well known by those skilled in the art. For example, the laminate can be obtained by overlaying a metal directly upon a commonly known polyimide film by, for example, the vacuum metallizing method, the sputtering method or the wet plating method. In this case, it is possible to successively laminate two or more metals or to laminate an alloy formed by mixing two or more metals.

Alternatively, the polyimide/metal laminate can be formed by laminating a metal layer on the polyimide film via an adhesive such as an epoxy, nylon, acrylic or imide adhesive. In this case, the adhesion face of the metal layer may be surface-treated by, for example, applying a coupling agent. It is also possible to use a mixture of two or more adhesives.

In the process of laminating a metal layer on the polyimide film via an adhesive, use may be made of publicly known methods such as heat lamination and heat pressing.

The film thickness of the polyimide film to be used in the polyimide/metal laminate according to the invention may be appropriately selected depending on the purpose. More particularly speaking, the film thickness ranges from 5 to 300 μm, preferably from 5 to 125 μm and still preferably from 10 to 75 μm. When flexibility is required, the polyimide film has preferably a thickness of 5 to 50 μm, more preferably 5 to 30 μm and most preferably 5 to 15 μm.

The polyimide/metal laminate obtained by the invention is applicable to flexible print wiring boards, multi-layered print wiring boards wherein flexible print wiring boards are laminated, rigid flex wiring boards wherein flexible print wiring boards are laminated on hard print wiring boards, tapes for tape automated bonding (TAB) wherein polyimide/metal laminates are applied to TAB, semiconductor packages such as chips on film (COF) wherein semiconductor devices are packaged directly on print wiring boards and multi chip modules (MCMs), magnetic recording films, solar batteries, coating films for aerospace materials and filmy resistance elements. The polyimide/metal laminate can be processed by publicly known methods appropriate for the use.

Use of the polyimide/metal laminate according to the invention makes it possible to obtain polyimide/metal laminates and flexible print wiring boards (in particular, flexible print wiring boards having high heat resistance with the use of imide adhesives), multi-layered print wiring boards wherein flexible print wiring boards are laminated, rigid flex wiring boards wherein flexible print wiring boards are laminated on hard print wiring boards, tapes for tape automated bonding (TAB) wherein polyimide/metal laminates are applied to TAB, semiconductor packages such as chips on film (COF) wherein semiconductor devices are packaged directly on print wiring boards and multi chip modules (MCMs), magnetic recording films, solar batteries, coating films for aerospace materials and filmy resistance elements according to the invention which are excellent in durability in strict environment with high temperature and high humidity and thus show high reliability.

The present invention will now be illustrated in greater detail with reference to the Examples in view of the Comparative Examples, but the present invention should not be construed as being limited thereto.

In the following Examples, the following analytical, measurement and evaluation methods were employed.

(Titanium Atom Number Concentration on Polyimide Film Surface)

Analysis was made by using an X-ray photoelectron diffractometer (Model-5400, manufactured by ULVAC PHI; X-ray source: Kα-ray of Mg, energy: 71.55 electron volt).

(Adhesive Strength)

In accordance with IPC-TM-650-method. 2.4.9., measurement was made at pattern intervals of 3 mm and at a peel angle of 90° and a peel speed of 50 mm/min. In Examples, a case where no peeling arose at the polyimide/adhesive interface because of the large interfacial adhesive strength is expressed C/A.

(Adhesive Strength of Polyimide/metal Laminate Formed by Vacuum Metallizing Method)

A copper layer (thickness: 2000 Å) was metallized on one face of a polyimide film by using an electron heating vacuum metallizer (EBH-6, manufactured by ULVAC). Further, a copper layer was formed directly on the polyimide film by copper sulfate electroplating (cathode current density: 2 A/dm$^2$, plating time: 40 minutes) without resort to any adhesive. The polyimide/metal laminate thus formed was exposed to the environment at 120° C. and 100% RH for 24 hours. Then the adhesive strength of the polyimide/metal laminate was measured.

(Adhesive Strength of Polyimide/metal Laminate Via Epoxy Adhesive)

An electrolytic copper foil (thickness: 35 μm) was laminated on a polyimide film by the heat lamination method with the use of an epoxy adhesive. Then the adhesive was cured in an oven to give a polyimide/metal laminate. After allowing to stand at 150° C. for 240 hours, the adhesive strength of the polyimide/metal laminate was measured.

(Adhesive Strength of Polyimide/metal Laminate Via Imide Adhesive)

A rolled copper foil (thickness: 17 μm) and a polyimide film were hot-pressed (260° C., 10 minutes) by using a sheet type thermoplastic polyimide adhesive to give a polyimide/metal laminate. Then the adhesive strength was measured.

Now, the effects of the invention will be more particularly illustrated by reference to the following Examples.

COMPARATIVE EXAMPLE 1

A converting agent composed of 17 g of acetic anhydride and 2 g of isoquinoline was mixed with 90 g of a 17% by weight solution of a polyamic acid, which had been synthesized by using pyromellitic acid dianhydride, 4,4'-diaminodiphenyl ether and p-phenylenediamine at a molar ratio of 4/3/1, in DMF. After stirring and defoaming by centrifugation, the mixture was cast and applied onto an aluminum foil to give a thickness of 700 μm. The stirring and defoaming operations were carried out under cooling at 0° C. The thus obtained aluminum foil/polyamic acid solution laminate was heated to 110° C. for 4 minutes to give a gel film having self-supporting properties. This gel film showed a residual content of volatiles 30% by weight and an imidization rate of 90%. The gel film was peeled from the aluminum foil and fixed in a frame. Then the gel film was heated to 300° C., 400° C. and 500° C. each for 1 minute to give a polyimide film of 50 μm in thickness.

The titanium atom number concentration on the surface of the polyimide film thus obtained was measured. Further the adhesive strengths of a polyimide/metal laminate formed by the vacuum metallizing method, a polyimide/metal laminate via an epoxy adhesive and a polyimide/metal laminate via an imide adhesive were measured. Table 1 summarizes the results.

EXAMPLE 1

A gel film obtained as in Comparative Example 1 was immersed in a solution (titanium element concentration: 100 ppm) of dihydroxytitaniumbislactate in isopropyl alcohol for 10 seconds. After removing the excessive droplets by blowing a compressed air stream, the film was heated under the same conditions as in Comparative Example 1 to give a polyimide film having titanium element on the surface. The polyimide film thus obtained had the same color tone as the one of Comparative Example 1. The titanium atom number concentration on the surface of the polyimide film thus obtained was measured. Further the adhesive strengths of a polyimide/metal laminate formed by the vacuum metallizing method, a polyimide/metal laminate via an epoxy adhesive and a polyimide/metal laminate via an imide adhesive were measured. Table 1 summarizes the results.

EXAMPLE 2

Onto a gel film obtained as in Comparative Example 1, a solution (titanium element concentration: 100 ppm) of dihydroxytitanium bislactate in isopropyl alcohol was applied by the spray coating method in such a manner as not giving any excessive droplet to the film. Then, the film was heated under the same conditions as in Comparative Example 1 to give a polyimide film having titanium element on the surface. The polyimide film thus obtained had the same color tone as the one of Comparative Example 1. The titanium atom number concentration on the surface of the polyimide film thus obtained was measured. Further the adhesive strengths of a polyimide/metal laminate formed by the vacuum metallizing method, a polyimide/metal laminate via an epoxy adhesive and a polyimide/metal laminate via an imide adhesive were measured. Table 1 summarizes the results.

EXAMPLE 3

A gel film obtained as in Comparative Example 1 was immersed in a solution (titanium element concentration: 100 ppm) of tri-N-butoxytitanium monostearate in toluene for 10 seconds. After removing the excessive droplets with nip rolls, the film was heated under the same conditions as in Comparative Example 1 to give a polyimide film having titanium element on the surface. The polyimide film thus obtained had the same color tone as the one of Comparative Example 1. The titanium atom number concentration on the surface of the polyimide film thus obtained was measured. Further the adhesive strengths of a polyimide/metal laminate formed by the vacuum metallizing method, a polyimide/metal laminate via an epoxy adhesive and a polyimide/metal laminate via an imide adhesive were measured. Table 1 summarizes the results.

TABLE 1

| Unit | Titanium atom number concentration on surface of film atm % | Adhesive strength of polyimide/metal laminate formed by vacuum metallizing N/m | Adhesive strength of polyimide/metal film via epoxy adhesive N/m | Adhesive strength of polyimide/metal film via imide adhesive N/m |
|---|---|---|---|---|
| Comp. Ex. 1 | 0 | 50 | 500 | 120 |
| Ex. 1 | 0.5 | 500 | 1000 | C/A |
| Ex. 2 | 3.0 | 500 | 1000 | C/A |
| Ex. 3 | 0.5 | 500 | 1000 | C/A |

COMPARATIVE EXAMPLE 2

A polyimide film was obtained in the same manner as in Comparative Example 1 except for synthesizing with the use of pyromellitic acid dianhydride and 4,4'-diaminidiphenyl ether at a molar ratio of 1/1. The titanium atom number concentration on the surface of the polyimide film thus obtained was measured. Further the adhesive strengths of a polyimide/metal laminate formed by the vacuum metallizing method, a polyimide/metal laminate via an epoxy adhesive and a polyimide/metal laminate via an imide adhesive were measured. Table 2 summarizes the results.

EXAMPLES 4 TO 6

Polyimide films were obtained in the same manner as in Examples 1 to 3 except for synthesizing with the use of pyromellitic acid dianhydride and 4,4'-diaminidiphenyl ether at a molar ratio of 1/1. The titanium atom number concentration on the surface of each polyimide film thus obtained was measured. Further the adhesive strengths of polyimide/metal laminates formed by the vacuum metallizing method, polyimide/metal laminates via an epoxy adhesive and polyimide/metal laminates via an imide adhesive were measured. Table 2 summarizes the results.

TABLE 2

| Unit | Titanium atom number concentration on surface of film atm % | Adhesive strength of polyimide/metal laminate formed by vacuum metallizing N/m | Adhesive strength of polyimide/metal film via epoxy adhesive N/m | Adhesive strength of polyimide/metal film via imide adhesive N/m |
|---|---|---|---|---|
| Comp. Ex. 2 | 0 | 30 | 450 | 100 |
| Ex. 4 | 0.5 | 300 | 900 | C/A |
| Ex. 5 | 3.0 | 300 | 900 | C/A |
| Ex. 6 | 0.5 | 300 | 900 | C/A |

COMPARATIVE EXAMPLE 3

A 17% by weight solution of a polyamic acid, which had been synthesized by using 3,3',4,4'-biphenyltetracarboxylic acid dianhydride, p-phenylenebis(trimellitic acid monoester acid anhydride), p-phenylenediamine and 4,4'-diaminodiphenyl ether at a molar ratio of 4/5/7/2, in DMAc was cast and applied onto an aluminum foil to give a thickness of 700 μm without adding any converting agent. The thus obtained aluminum foil/polyamic acid solution laminate was heated to 110° C. for 10 minutes to give a gel film having self-supporting properties. This gel film showed a residual content of volatiles 30% by weight and an imidization rate of 50%. By using this gel film, a polyimide film was obtained as in Comparative Example 1. The titanium atom number concentration on the surface of the polyimide film thus obtained was measured. Further the adhesive strengths of a polyimide/metal laminate formed by the vacuum metallizing method, a polyimide/metal laminate via an epoxy adhesive and a polyimide/metal laminate via an imide adhesive were measured. Table 3 summarizes the results.

EXAMPLES 7 TO 9

Polyimide films were obtained in the same manner as in Examples 1 to 3 except for using the gel film obtained as in Comparative Example 3. The titanium atom number concentration on the surface of each polyimide film thus obtained was measured. Further the adhesive strengths of polyimide/metal laminates formed by the vacuum metallizing method, polyimide/metal laminates via an epoxy adhesive and polyimide/metal laminates via an imide adhesive were measured. Table 3 summarizes the results.

TABLE 3

| Unit | Titanium atom number concentration on surface of film atm % | Adhesive strength of polyimide/metal laminate formed by vacuum metallizing N/m | Adhesive strength of polyimide/metal film via epoxy adhesive N/m | Adhesive strength of polyimide/metal film via imide adhesive N/m |
|---|---|---|---|---|
| Comp. Ex. 3 | 0 | 60 | 500 | 200 |
| Ex. 7 | 0.5 | 600 | 1000 | C/A |
| Ex. 8 | 3.0 | 600 | 1000 | C/A |
| Ex. 9 | 0.5 | 600 | 1000 | C/A |

COMPARATIVE EXAMPLE 4

A polyimide film was obtained in the same manner as in Comparative Example 1 except for synthesizing with the use of pyromellitic acid dianhydride, p-phenylenebis(trimellitic acid monoester acid anhydride), p-phenylenediamine and 4,4'-diaminidiphenyl ether at a molar ratio of 5/5/4/6. The titanium atom number concentration on the surface of the polyimide film thus obtained was measured. Further the adhesive strengths of a polyimide/metal laminate formed by the vacuum metallizing method, a polyimide/metal laminate via an epoxy adhesive and a polyimide/metal laminate via an imide adhesive were measured. Table 4 summarizes the results.

EXAMPLES 10 TO 12

Polyimide films were obtained in the same manner as in Examples 1 to 3 except for using the gel film obtained as in Comparative Example 4. The titanium atom number concentration on the surface of each polyimide film thus obtained was measured. Further the adhesive strengths of polyimide/metal laminates formed by the vacuum metallizing method, polyimide/metal laminates via an epoxy adhesive and polyimide/metal laminates via an imide adhesive were measured. Table 4 summarizes the results.

TABLE 4

| Unit | Titanium atom number concentration on surface of film atm % | Adhesive strength of polyimide/metal laminate formed by vacuum metallizing N/m | Adhesive strength of polyimide/metal film via epoxy adhesive N/m | Adhesive strength of polyimide/metal film via imide adhesive N/m |
|---|---|---|---|---|
| Comp. Ex. 4 | 0 | 60 | 500 | 330 |
| Ex. 10 | 0.5 | 600 | 1000 | C/A |
| Ex. 11 | 3.0 | 600 | 1000 | C/A |
| Ex. 12 | 0.5 | 600 | 1000 | C/A |

COMPARATIVE EXAMPLE 5

A polyimide film (thickness: 25 μm) was obtained in the same manner as in Comparative Example 1 except for casting and applying a mixture of the polyamic acid with a converting agent onto a glass plate to give a thickness of 350 μm. The titanium atom number concentration on the surface of the polyimide film thus obtained was measured. Further the adhesive strengths of a polyimide/metal laminate formed by the vacuum metallizing method, a polyimide/metal laminate via an epoxy adhesive and a polyimide/metal laminate via an imide adhesive were measured. Table 5 summarizes the results.

EXAMPLES 13 TO 15

Polyimide films were obtained in the same manner as in Examples 1 to 3 except for using the gel film obtained as in Comparative Example 5. The titanium atom number concentration on the surface of each polyimide film thus obtained was measured. Further the adhesive strengths of polyimide/metal laminates formed by the vacuum metallizing method, polyimide/metal laminates via an epoxy adhesive and polyimide/metal laminates via an imide adhesive were measured. Table 5 summarizes the results.

TABLE 5

| Unit | Titanium atom number concentration on surface of film atm % | Adhesive strength of polyimide/metal laminate formed by vacuum metallizing N/m | Adhesive strength of polyimide/metal film via epoxy adhesive N/m | Adhesive strength of polyimide/metal film via imide adhesive N/m |
|---|---|---|---|---|
| Comp. Ex. 5 | 0 | 20 | 400 | 150 |
| Ex. 13 | 0.5 | 200 | 800 | 1350 |
| Ex. 14 | 3.0 | 200 | 800 | 1350 |
| Ex. 15 | 0.5 | 200 | 800 | 1350 |

COMPARATIVE EXAMPLE 6 AND EXAMPLES 16 to 18

Polyimide films were obtained in the same manner as in Comparative Example 2 and Examples 4 to 6 except for casting and applying a mixture of the polyamic acid with a converting agent onto a glass plate to give a thickness of 350 μm. The titanium atom number concentration on the surface of each polyimide film thus obtained was measured. Further the adhesive strengths of a polyimide/metal laminate formed by the vacuum metallizing method, a polyimide/metal laminate via an epoxy adhesive and a polyimide/metal laminate via an imide adhesive were measured. Table 6 summarizes the results.

TABLE 6

| Unit | Titanium atom number concentration on surface of film atm % | Adhesive strength of polyimide/metal laminate formed by vacuum metallizing N/m | Adhesive strength of polyimide/metal film via epoxy adhesive N/m | Adhesive strength of polyimide/metal film via imide adhesive N/m |
|---|---|---|---|---|
| Comp. Ex. 6 | 0 | 15 | 350 | 120 |
| Ex. 16 | 0.5 | 150 | 700 | 1200 |
| Ex. 17 | 3.0 | 150 | 700 | 1200 |
| Ex. 18 | 0.5 | 150 | 700 | 1200 |

COMPARATIVE EXAMPLE 7 AND EXAMPLES 19 to 21

Polyimide films were obtained in the same manner as in Comparative Example 3 and Examples 7 to 9 except for casting and applying a mixture of the polyamic acid with a converting agent onto a glass plate to give a thickness of 350 μm. The titanium atom number concentration on the surface of each polyimide film thus obtained was measured. Further the adhesive strengths of a polyimide/metal laminate formed by the vacuum metallizing method, a polyimide/metal laminate via an epoxy adhesive and a polyimide/metal laminate via an imide adhesive were measured. Table 7 summarizes the results.

TABLE 7

| Unit | Titanium atom number concentration on surface of film atm % | Adhesive strength of polyimide/ metal laminate formed by vacuum metallizing N/m | Adhesive strength of polyimide/ metal film via epoxy adhesive N/m | Adhesive strength of polyimide/ metal film via imide adhesive N/m |
|---|---|---|---|---|
| Comp. Ex. 7 | 0 | 30 | 400 | 200 |
| Ex. 19 | 0.5 | 300 | 800 | 1200 |
| Ex. 20 | 3.0 | 300 | 800 | 1200 |
| Ex. 21 | 0.5 | 300 | 800 | 1200 |

COMPARATIVE EXAMPLE 8 AND EXAMPLES 22 to 24

Polyimide films were obtained in the same as in Comparative Example 4 and Examples 10 to 12 except for casting and applying a mixture of the polyamic acid with a converting agent onto a glass plate to give a thickness of 350 µm. The titanium atom number concentration on the surface of each polyimide film thus obtained was measured. Further the adhesive strengths of a polyimide/metal laminate formed by the vacuum metallizing method, a polyimide/metal laminate via an epoxy adhesive and a polyimide/metal laminate via an imide adhesive were measured. Table 8 summarizes the results.

TABLE 8

| Unit | Titanium atom number concentration on surface of film atm % | Adhesive strength of polyimide/ metal laminate formed by vacuum metallizing N/m | Adhesive strength of polyimide/ metal film via epoxy adhesive N/m | Adhesive strength of polyimide/ metal film via imide adhesive N/m |
|---|---|---|---|---|
| Comp. Ex. 8 | 0 | 30 | 400 | 120 |
| Ex. 22 | 0.5 | 300 | 800 | C/A |
| Ex. 23 | 3.0 | 300 | 800 | C/A |
| Ex. 24 | 0.5 | 300 | 800 | C/A |

COMPARATIVE EXAMPLE 9

A polyimide film (thickness: 12 µm) was obtained in the same manner as in Comparative Example 1 except for casting and applying a mixture of the polyamic acid with a converting agent onto a glass plate to give a thickness of 200 µm. The titanium atom number concentration on the surface of the polyimide film thus obtained was measured. Further the adhesive strengths of a polyimide/metal laminate formed by the vacuum metallizing method, a polyimide/metal laminate via an epoxy adhesive and a polyimide/metal laminate via an imide adhesive were measured. Table 9 summarizes the results.

EXAMPLES 25 to 27

Polyimide films were obtained in the same manner as in Examples 1 to 3 except for using the gel film obtained as in Comparative Example 9. The titanium atom number concentration on the surface of each polyimide film thus obtained was measured. Further the adhesive strengths of polyimide/metal laminates formed by the vacuum metallizing method, polyimide/metal laminates via an epoxy adhesive and polyimide/metal laminates via an imide adhesive were measured. Table 9 summarizes the results.

TABLE 9

| Unit | Titanium atom number concentration on surface of film atm % | Adhesive strength of polyimide/ metal laminate formed by vacuum metallizing N/m | Adhesive strength of polyimide/ metal film via epoxy adhesive N/m | Adhesive strength of polyimide/ metal film via imide adhesive N/m |
|---|---|---|---|---|
| Comp. Ex. 9 | 0 | 25 | 350 | 120 |
| Ex. 25 | 0.5 | 250 | 650 | 840 |
| Ex. 26 | 3.0 | 250 | 650 | 840 |
| Ex. 27 | 0.5 | 250 | 650 | 840 |

COMPARATIVE EXAMPLE 10 AND EXAMPLES 28 to 30

Polyimide films were obtained in the same manner as in Comparative Example 2 and Examples 4 to 6 except for casting and applying a mixture of the polyamic acid with a converting agent onto a glass plate to give a thickness of 200 µm. The titanium atom number concentration on the surface of each polyimide film thus obtained was measured. Further the adhesive strengths of a polyimide/metal laminate formed by the vacuum metallizing method, a polyimide/metal laminate via an epoxy adhesive and a polyimide/metal laminate via an imide adhesive were measured. Table 10 summarizes the results.

TABLE 10

| Unit | Titanium atom number concentration on surface of film atm % | Adhesive strength of polyimide/ metal laminate formed by vacuum metallizing N/m | Adhesive strength of polyimide/ metal film via epoxy adhesive N/m | Adhesive strength of polyimide/ metal film via imide adhesive N/m |
|---|---|---|---|---|
| Comp. Ex. 10 | 0 | 20 | 250 | 150 |
| Ex. 28 | 0.5 | 200 | 500 | 750 |
| Ex. 29 | 3.0 | 200 | 500 | 750 |
| Ex. 30 | 0.5 | 200 | 500 | 750 |

COMPARATIVE EXAMPLE 11 AND EXAMPLES 31 to 33

Polyimide films were obtained in the same manner as in Comparative Example 3 and Examples 7 to 9 except for casting and applying a mixture of the polyamic acid with a converting agent onto a glass plate to give a thickness of 200 µm. The titanium atom number concentration on the surface of each polyimide film thus obtained was measured. Further the adhesive strengths of a polyimide/metal laminate formed by the vacuum metallizing method, a polyimide/metal laminate via an epoxy adhesive and a polyimide/metal laminate via an imide adhesive were measured. Table 11 summarizes the results.

TABLE 11

| Unit | Titanium atom number concentration on surface of film atm % | Adhesive strength of polyimide/ metal laminate formed by vacuum metallizing N/m | Adhesive strength of polyimide/ metal film via epoxy adhesive N/m | Adhesive strength of polyimide/ metal film via imide adhesive N/m |
|---|---|---|---|---|
| Comp. Ex. 11 | 0 | 30 | 350 | 150 |
| Ex. 31 | 0.5 | 300 | 650 | 900 |
| Ex. 32 | 3.0 | 300 | 650 | 900 |
| Ex. 33 | 0.5 | 300 | 650 | 900 |

COMPARATIVE EXAMPLE 12 AND EXAMPLES 34 to 36

Polyimide films were obtained in the same manner as in Comparative Example 4 and Examples 10 to 12 except for casting and applying a mixture of the polyamic acid with a converting agent onto a glass plate to give a thickness of 200 μm. The titanium atom number concentration on the surface of each polyimide film thus obtained was measured. Further the adhesive strengths of a polyimide/metal laminate formed by the vacuum metallizing method, a polyimide/metal laminate via an epoxy adhesive and a polyimide/metal laminate via an imide adhesive were measured. Table 12 summarizes the results.

TABLE 12

| Unit | Titanium atom number concentration on surface of film atm % | Adhesive strength of polyimide/ metal laminate formed by vacuum metallizing N/m | Adhesive strength of polyimide/ metal film via epoxy adhesive N/m | Adhesive strength of polyimide/ metal film via imide adhesive N/m |
|---|---|---|---|---|
| Comp. Ex. 12 | 0 | 20 | 300 | 40 |
| Ex. 34 | 0.5 | 200 | 600 | C/A |
| Ex. 35 | 3.0 | 200 | 600 | C/A |
| Ex. 36 | 0.5 | 200 | 600 | C/A |

EXAMPLE 37

Environmental Resistance of Polyimide Films

The tear propagation strength of each of the polyimide films obtained in Comparative Examples 5 to 8 and Examples 13 to 24 was measured before and after exposing to the environment at 150° C. and 100% RH for 24 hours in accordance with the method as specified in IPC-2.4.17.1. Next, the retention after the exposure was calculated in accordance with the following formula 3. Table 13 summarizes the results.

$$G/H \quad \text{Formula 3}$$

wherein G represents the tear propagation strength after the exposure to the environment at 150° C. and 100% RH for 24 hours; and H represents the tear propagation strength before the exposure.

TABLE 13

| Unit | Before exposure Mn | After exposure mN | Retention % |
|---|---|---|---|
| Comp. Ex. 5 | 72.5 | 28.4 | 39 |
| Ex. 13 | 68.6 | 58.8 | 86 |
| Ex. 14 | 71.5 | 58.8 | 82 |
| Ex. 15 | 72.5 | 63.8 | 88 |
| Comp. Ex. 6 | 73.5 | 27.2 | 37 |
| Ex. 16 | 72.5 | 62.3 | 86 |
| Ex. 17 | 74.5 | 63.3 | 85 |
| Ex. 18 | 70.6 | 58.6 | 82 |
| Comp. Ex. 7 | 60.8 | 15.2 | 25 |
| Ex. 19 | 61.7 | 51.8 | 84 |
| Ex. 20 | 63.7 | 52.2 | 82 |
| Ex. 21 | 59.8 | 53.2 | 89 |
| Comp. Ex. 8 | 48.0 | 17.8 | 37 |
| Ex. 22 | 44.1 | 36.6 | 83 |
| Ex. 23 | 48.0 | 41.3 | 86 |
| Ex. 24 | 50.0 | 44.0 | 88 |

COMPARATIVE EXAMPLE 13 AND EXAMPLE 38

Copper layer (about 2000 A) was deposited onto polyimide films obtained in the same manner as in Comparative Example 4 and Example 10 by the sputtering method and then treated by the electroplating method to obtain polyimide/metal laminates having a copper thickness of 20 μm. The adhesive strengths of the resulting polyimide/metal laminates before and after heating at 170° C. for 30 minutes were measured. Table 14 summarizes the results.

TABLE 14

| Unit | Adhesive strength before heating at 170° C. N/m | Adhesive strength after heating at 170° C. for 30 min. N/m |
|---|---|---|
| Comp. Ex. 13 | 40 | 170 |
| Ex. 38 | 670 | 1090 |

As described above, the polyimide/metal laminates and flexible print wiring boards (in particular, flexible print wiring boards having high heat resistance with the use of imide adhesives), multi-layered print wiring boards wherein flexible print wiring boards are laminated, rigid flex wiring boards wherein flexible print wiring boards are laminated on hard print wiring boards, tapes for tape automated bonding (TAB) wherein polyimide/metal laminates are applied to TAB, semiconductor packages such as chips on film (COF) wherein semiconductor devices are packaged directly on print wiring boards and multi chip modules (MCMs), magnetic recording films, solar batteries, coating films for aerospace materials and filmy resistance elements according to the invention are excellent in environmental resistance, in particular, adhesion after exposure to the environment with high temperature and high humidity. Owing to these characteristics, it is possible to obtain polyimide/metal laminates appropriately usable in the circuits of electrical apparatuses which can be operated under severe conditions (i.e., high temperature and high humidity) without fail and other various purposes.

While the invention has been described in detail and with reference to specific examples thereof, it will be apparent to one skilled in the art that various changes and modifications can be made therein without departing from the spirit and scope thereof.

What is claimed is:

1. A flexible printed wiring board obtained by patterning by etching the metal layer of a polyimide/metal laminate, said polyimide/metal laminate having a polyimide film and a metal layer laminated thereon, wherein said polyimide film contains titanium element, wherein the titanium element concentration at a center of said polyimide film thickness direction is 1/10 or less of the titanium element concentration on a surface of the polyimide film, wherein said polyimide film has a titanium atom number concentration on the surface of said polyimide film, determined by X-ray photoelectron spectroscopy, of from 0.01% to 10%.

2. The flexible printed wiring board as claimed in claim 1, wherein the polyimide film is obtained by casting or applying a polyamic acid onto a substrate; drying the same to give a partly cured or partly dried film made of the polyamic acid or a polyimide; applying an organic solvent solution containing titanium element on the surface of said film, or immersing said film in an organic solvent solution containing titanium element; then converting said polyamic acid into the polyimide; and drying said film.

3. A flexible printed wiring board obtained by patterning by etching the metal layer of a polyimide/metal laminate, said polyimide/metal laminate having a polyimide film and a metal layer laminated thereon, wherein said polyimide film is obtained by casting or applying a polyamic acid onto a substrate; drying the same to give a partly cured or partly dried film made of the polyamic acid or a polyimide; applying an organic solvent solution containing titanium element on the surface of said film, or immersing said film in an organic solvent solution containing titanium element; then converting said polyamic acid into the polyimide; and drying said film, wherein the titanium element concentration at a center of said polyimide film thickness direction is 1/10 or less of the titanium element concentration on a surface of the polyimide film, wherein said polyimide film has a titanium atom number concentration on the surface of said polyimide film, determined by X-ray photoelectron spectroscopy, of from 0.01% to 10%.

4. The flexible printed wiring board as claimed in claim 2 or 3, wherein the polyimide film is obtained by applying an organic solvent solution containing titanium element onto the surface of said partly cured or partly dried polyamic acid or polyimide film, or immersing said film in an organic solvent solution containing titanium element; removing excess droplets remaining on the film surface; then converting said polyamic acid into the polyimide; and drying said film.

5. The flexible printed wiring board as claimed in claim 2 or 3, wherein said organic solvent solution containing titanium element is a solution of an organotitanium compound in an organic solvent.

6. The flexible printed wiring board as claimed in claim 5, wherein said organotitanium compound is one represented by the following chemical formula:

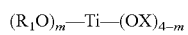

wherein m is an integer of 0 to 4; and x represents

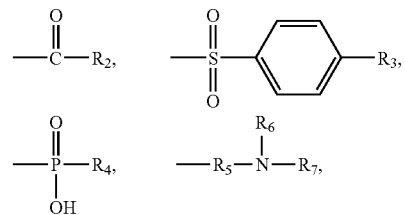

(Wherein $R_1$ represents a hydrogen atom or a $C_{3-18}$ hydrocarbyl group; $R_2$ and $R_3$ represent each and $C_{3-18}$ hydrocarbyl group; $R_4$ represents a $C_{3-18}$ hydrocarbyl group or

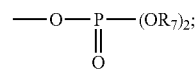

$R_5$ and $R_6$ represent each a $C_{3-18}$ hydrocarbyl group; and $R_7$ represents a $C_{2-18}$ hydrocarbyl group), a $C_{3-18}$ hydrocarbyl or carboxylate group or ammonium salts thereof.

7. The flexible printed wiring board as claimed in claim 1 or 3 which is obtained by laminating said metal directly on said polyimide film by vacuum metallizing method, sputtering method or wet plating method, wherein an adhesive strength between said polyimide and said metal measured at pattern intervals of 3 mm and at a peel angle of 90° and a peel speed of 50 mm/min is 1000 N/m or more.

8. The flexible printed wiring board as claimed in claim 1 or 3, wherein said polyimide film is obtained by dehydrocyclizing a polyamic acid comprising as main components pyromellitic anhydride and 4,4'-diaminodiphenyl ether.

9. The flexible printed wiring board as claimed in claim 1 or 3, wherein said polyimide film is obtained by dehydrocyclizing a polyamic acid comprising as main components three components of pyromellitic anhydride, 4,4'-diaminodiphenyl ether and p-phenylenediamine.

10. The flexible printed wiring board as claimed in claim 1 or 3, wherein said polyimide film is obtained by dehydrocyclizing a polyamic acid comprising as main components four components of pyromellitic anhydride, 4,4'-diaminodiphenyl ether, p-phenylenediamine and p-phenylenebis(trimellitic acid monoester acid anhydride).

11. A multi-layered printed wiring board, wherein plural flexible printed wiring boards as claimed in claim 1 or 3 are laminated.

12. A rigid flex wiring board, wherein the flexible printed wiring board as claimed in claim 1 or 3 is laminated on a hard printed wiring board.

13. A tape for tape automated bonding (TAB) appropriate for semiconductor packaging, wherein a polyimide/metal laminate has a polyimide film and a metal layer, wherein said polyimide film contains titanium element, wherein the titanium element concentration at a center of said polyimide film thickness direction is 1/10 or less of the titanium element concentration on a surface of the polyimide film, wherein said polyimide film has a titanium atom number concentration on the surface of said polyimide film, determined by X-ray photoelectron spectroscopy, of from 0.01% to 10%.

14. The tape for tape automated bonding (TAB) as claimed in claim 13, wherein said polyimide film is obtained by casting or applying a polyamic acid onto a substrate; drying the same to give a partly cured or partly dried film made of the polyamic acid or a polyimide; applying an organic solvent solution containing titanium element on the surface of said film, or immersing said film in an organic solvent solution containing titanium element; then converting said polyamic acid into the polyimide; and drying said film.

15. A tape for tape automated bonding (TAB) appropriate for semiconductor packaging, wherein a polyimide/metal laminate has a polyimide film and a metal layer, wherein said polyimide film is obtained by casting or applying a polyamic acid onto a substrate; drying the same to give a partly cured or partly dried film made of the polyamic acid or a polyimide; applying an organic solvent solution containing titanium element on the surface of said film, or immersing said film in an organic solvent solution containing titanium element; then converting said polyamic acid into the polyimide; and drying said film, wherein the titanium element concentration at a center of said polyimide film thickness direction is 1/10 or less of the titanium element concentration on a surface of the polyimide film, wherein said polyimide film has a titanium atom number concentration on the surface of said polyimide film, determined by X-ray photoelectron spectroscopy, of from 0.01% to 10%.

16. A chip on film (COF) having a semiconductor device directly packaged on a printed wiring board, wherein a polyimide/metal laminate has a polyimide film and a metal layer, wherein said polyimide film contains titanium element, wherein the titanium element concentration at a center of said polyimide film thickness direction is 1/10 or less of the titanium element concentration on a surface of the polyimide film, wherein said polyimide film has a titanium atom number concentration on the surface of said polyimide film, determined by X-ray photoelectron spectroscopy, of from 0.01% to 10%.

17. The chip on film (COF) as claimed in claim 16, wherein said polyimide film is obtained by casting or applying a polyamic acid onto a substrate; drying the same to give a partly cured or partly dried film made of the polyamic acid or a polyimide; applying an organic solvent solution containing titanium element on the surface of said film, or immersing said film in an organic solvent solution containing titanium element; then converting said polyamic acid into the polyimide; and drying said film.

18. A chip on film (COF) having a semiconductor device directly packaged on a printed wiring board, wherein a polyimide/metal laminate has a polyimide film and a metal layer, wherein said polyimide film is obtained by casting or applying a polyamic acid onto a substrate; drying the same to give a partly cured or partly dried film made of the polyamic acid or a polyimide; applying an organic solvent solution containing titanium element on the surface of said film, or immersing said film in an organic solvent solution containing titanium element; then converting said polyamic acid into the polyimide; and drying said film, wherein the titanium element concentration at a center of said polyimide film thickness direction is 1/10 or less of the titanium element concentration on a surface of the polyimide film, wherein said polyimide film has a titanium atom number concentration on the surface of said polyimide film, determined by X-ray photoelectron spectroscopy, of from 0.01% to 10%.

19. A flexible printed wiring board comprising a polyimide film and a metal layer laminated thereon, wherein said polyimide film is obtained by casting or applying a polyamic acid onto a substrate; drying the same to give a partly cured or partly dried film made of the polyamic acid or a polyimide; applying an organic solvent solution containing titanium element on the surface of said film, or immersing said film in an organic solvent solution containing titanium element; then converting said polyamic acid into the polyimide; and drying said film, wherein said polyimide film is obtained by dehydrocyclizing a polyamic acid comprising as main components four components of pyromellitic anhydride, 4,4'-diaminodiphenyl ether, p-phenylenediamine and p-phenylenebis(trimellitic acid monoester acid anhydride).

* * * * *